(12) United States Patent
Liu et al.

(10) Patent No.: US 7,964,476 B2
(45) Date of Patent: Jun. 21, 2011

(54) METHOD AND APPARATUS FOR THE LASER SCRIBING OF ULTRA LIGHTWEIGHT SEMICONDUCTOR DEVICES

(75) Inventors: Shengzhong Liu, Rochester Hills, MI (US); Ginger Pietka, Harrison Township, MI (US); Kevin Beernink, Clarkston, MI (US); Arindam Banerjee, Bloomfield Hills, MI (US); Chi Yang, Troy, MI (US); Subhendu Guha, Bloomfield Hills, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 348 days.

(21) Appl. No.: 12/053,712

(22) Filed: Mar. 24, 2008

(65) Prior Publication Data

US 2008/0233715 A1      Sep. 25, 2008

Related U.S. Application Data

(60) Provisional application No. 60/896,292, filed on Mar. 22, 2007.

(51) Int. Cl.
*H01L 21/00* (2006.01)
(52) U.S. Cl. .............................. 438/463; 438/460
(58) Field of Classification Search ........... 438/460–464
See application file for complete search history.

(56) References Cited

U.S. PATENT DOCUMENTS

| | | | |
|---|---|---|---|
| 4,517,403 A | 5/1985 | Morel et al. | |
| 4,667,058 A | 5/1987 | Catalano et al. | |
| 4,754,544 A | 7/1988 | Hanak | |
| 4,954,181 A | 9/1990 | Nishiura et al. | |
| 5,217,921 A | 6/1993 | Kaido et al. | |
| 5,268,037 A | 12/1993 | Glatfelter | |
| 5,468,988 A | 11/1995 | Glatfelter et al. | |
| 6,011,215 A | 1/2000 | Glatfelter et al. | |
| 6,468,828 B1 | 10/2002 | Glatfelter et al. | |
| 6,562,698 B2 * | 5/2003 | Manor | 438/460 |
| 6,767,762 B2 | 7/2004 | Guha | |
| 6,803,513 B2 | 10/2004 | Beernink et al. | |
| 7,259,321 B2 | 8/2007 | Oswald et al. | |

FOREIGN PATENT DOCUMENTS

KR            100648898 B1      11/2006

* cited by examiner

*Primary Examiner* — Richard A. Booth
(74) *Attorney, Agent, or Firm* — Gifford, Krass, Sprinkle, Anderson & Citkowski, P.C.

(57) ABSTRACT

A system for the laser scribing of semiconductor devices includes a laser light source operable to selectably deliver laser illumination at a first wavelength and at a second wavelength which is shorter than the first wavelength. The system further includes a support for a semiconductor device and an optical system which is operative to direct the laser illumination from the light source to the semiconductor device. The optical system includes optical elements which are compatible with the laser illumination of the first wavelength and the laser illumination of the second wavelength. In specific instances, the first wavelength is long wavelength illumination such as illumination of at least 1000 nanometers, and the second wavelength is short wavelength illumination which in specific instances is 300 nanometers or shorter. By the use of the differing wavelengths, specific layers of the semiconductor device may be scribed without damage to subjacent layers. Also disclosed are specific scribing processes.

12 Claims, 3 Drawing Sheets

METHOD AND APPARATUS FOR THE LASER SCRIBING OF ULTRA LIGHTWEIGHT SEMICONDUCTOR DEVICES

CROSS-REFERENCE TO RELATED APPLICATIONS

This application claims priority of U.S. Provisional Patent Application Ser. No. 60/896,292 filed Mar. 22, 2007, entitled "Method and Apparatus for the Laser Scribing of Ultra Lightweight Semiconductor Devices" which is incorporated herein by reference.

STATEMENT OF GOVERNMENT INTEREST

This invention was made at least in part under Air Force Research Laboratory Contract F29601-03-C-0122. The Government may have rights under this invention.

FIELD OF THE INVENTION

This invention relates generally to semiconductor devices and to methods and apparatus for their fabrication. More specifically, the invention relates to methods and apparatus for the fabrication of ultra lightweight semiconductor devices such as photovoltaic devices.

BACKGROUND OF THE INVENTION

In a number of instances, laser scribing and welding processes are used in the fabrication of thin film semiconductor devices. These devices may comprise photovoltaic devices as well as other devices such as photodetector arrays, electrophotographic components, integrated circuits, and the like. In the context of this disclosure, the invention will be explained primarily with respect to the fabrication of thin film photovoltaic modules; however, it is to be understood that the principles disclosed herein are applicable to other types of semiconductor devices. In the fabrication of thin film photovoltaic modules, a series of scribing and laser welding steps are utilized to configure various electrode and semiconductor layers into an array of individual cells which are interconnected in a series and/or parallel relationship.

Such laser fabrication processes are precise and quick; and hence, such techniques are very often used in the fabrication of photovoltaic modules and other semiconductor devices. Some such laser fabrication processes are shown in U.S. Pat. Nos. 6,767,762; 5,268,037; 6,011,215 and 5,468,988. Typically such devices of the prior art are fabricated on relatively thick substrates such as sheet metal or glass. However, there is growing interest in the fabrication of ultra lightweight semiconductor devices, and in particular ultra lightweight photovoltaic devices. In general, lightweight photovoltaic devices are understood to be devices producing upward of approximately 1,000 watts per kilogram of weight and ultra lightweight photovoltaic devices are understood to be capable of producing upwards of approximately 2,000 watts per kilogram of weight. Such ultra lightweight devices are fabricated on thin, flexible substrates which can include polymeric materials such as polyimides. Problems occur when laser fabrication techniques are utilized in connection with such ultra lightweight devices, since the substrates themselves typically absorb most commonly employed laser wavelengths. Furthermore, the ultra lightweight substrates have a very low thermal mass. As a result, laser processing techniques can cause thermal damage to the substrates as well as to semiconductor and electrode layers supported thereupon.

Hence, the advantages of laser fabrication technology have not been, heretofore, successfully applied to the manufacture of thin film, ultra lightweight semiconductor devices.

As will be described hereinbelow, the present invention provides methods, systems and apparatus which may be utilized to adapt laser technologies to the fabrication of ultra lightweight photovoltaic modules and other semiconductor devices.

BRIEF DESCRIPTION OF THE INVENTION

The present invention is directed to a system for laser scribing a semiconductor device. The system includes a laser light source which is operable to selectably deliver laser illumination at a first wavelength and at a second wavelength which is shorter than the first wavelength. The system includes a support for a semiconductor device, and an optical system which is operative to direct laser illumination from the laser light source to a semiconductor device retained upon the support. The optical system includes optical elements which are compatible with laser illumination at the first wavelength and at the second wavelength. The optical system is operable to scan the laser illumination across a semiconductor device which is retained upon the support. In specific embodiments, the first wavelength is equal to or greater than 1000 nanometers. In further embodiments, the second wavelength is equal to or shorter than 300 nanometers. The laser may be capable of operating in a pulsed mode with regard to at least one of the wavelengths and such pulses may be ultra short pulses such as nanosecond, picosecond, or femtosecond pulse lengths.

Also disclosed are methods for scribing layers of materials by utilizing a laser beam having a wavelength of less than or equal to 300 nanometers. In a specific instance, there is disclosed a method for fabricating a semiconductor device by a process wherein a first electrode material is disposed on a substrate and scribed to form a plurality of spaced apart, electrically isolated bodies of electrode material. A body of semiconductor material is disposed in a superposed relationship with the scribed, first electrode, and a second electrode is then disposed in a superposed relationship with the semiconductor body. The second electrode is scribed utilizing a laser having an output wavelength of 300 nanometers or less. In a further step, at least one selected portion of the second electrode is illuminated with a laser beam so as to form an electrically conductive channel through the body of semiconductor material. The channel has an electrical resistivity which is lower than the resistivity of the remainder of the semiconductor body and establishes electrical contact between the electrodes. In specific instances, the scribing of the first electrode may be carried out utilizing a laser, and in particular instances, this laser has a wavelength of at least 1000 nanometers. In specific instances, the method may be carried out utilizing the aforedescribed dual wavelength laser system. The method and apparatus may be utilized for the verification of thin film semiconductor devices, such as photovoltaic devices which include group IV thin film semiconductor alloy layers.

DETAILED DESCRIPTION OF THE INVENTION

As will be described herein, it has been found that laser scribing, welding and such fabrication techniques may be adapted for use in connection with thin film, ultra lightweight semiconductor devices by appropriately choosing laser wavelengths and illumination profiles so as to prevent damage to substrates and semiconductor layers. In particular, it has been found that deep ultraviolet illumination (which is understood herein to include illumination at wavelengths of 300 nanometers or less), particularly when applied in a series of short pulses, can provide for the differential scribing of electrode layers and semiconductor devices without generation of excessive heat which could damage either the materials comprising these layers or a lightweight substrate upon which they are disposed. It has further been found that longer, thermal, infrared, wavelengths, typically of 1000 nanometers or more, may be used for other operations in device fabrication such as laser welding of layers, and in some instances, particular scribing steps.

In accord with another aspect of this invention, it has been found that a single laser system may be operated so as to provide both deep ultraviolet and infrared wavelengths. A system capable of providing such dual wavelengths, when used in combination with an optical system capable of operating at both wavelengths, will greatly simplify a process for fabricating ultra lightweight semiconductor devices. Since a single optical path and set of optics may be used for operations at both wavelengths, problems of system alignment and control are greatly reduced.

In one particular system, illumination is provided by a diode pumped Nd:YVO$_4$ laser system which outputs a fundamental wavelength at 1064 nanometers and a fourth harmonic deep UV beam at 266 nm. A laser system of this type can provide high power, deep ultraviolet radiation, typically of at least 3 watts at 266 nm, with very short pulse duration and high-speed repetition. In particular systems, pulse width can be as narrow as approximately 10 nSec at a 15 kHz rate. Systems of this type can operate at a pulse repetition rate up to 100 kHz.

Figure 1:
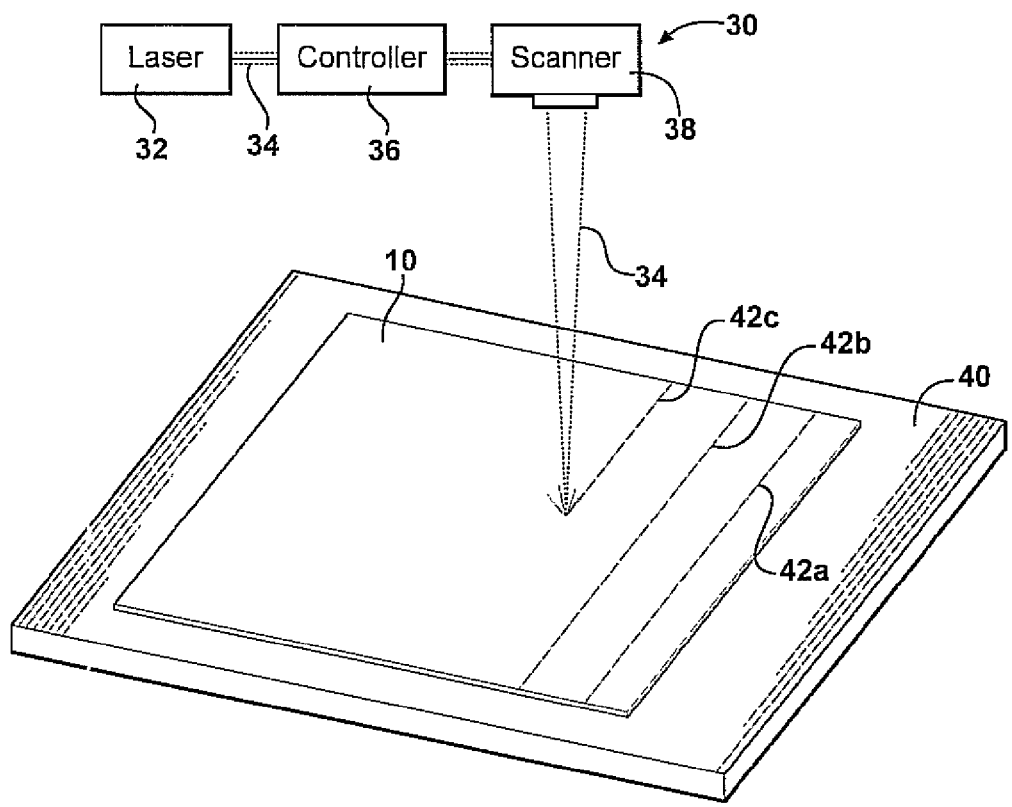
FIG. 1 is a schematic depiction of a laser scribing system of the present invention.

Referring now to FIG. 1, there is shown a schematic depiction of a laser scribing system 30 which is operational to scribe a semiconductor device 10. The system 30 includes a laser light source 32 which is capable of being operated so as to produce two distinct wavelengths of light. In accord with the present invention, one wavelength is a short wavelength, typically of 300 nm or less, and the other wavelength is a long, thermal wavelength, typically of 1000 nm or more. As discussed above, the laser may, in specific instances, be a diode pumped Nd:YVO$_4$ laser. This laser is capable of operating in a pulse mode and providing very short pulse lengths at a high rate of repetition. Other laser systems may similarly be incorporated into the apparatus of the present invention. The drawing of FIG. 1 is simplified and does not show all of the control and support circuitry and systems for the laser; however, such systems are very well known in the art and will be readily apparent to those of skill. The laser 32 produces a beam 34 which passes through a controller 36. This controller may comprise one or more units which are operable to select the appropriate wavelength of laser illumination, control pulse length, and/or otherwise condition the laser beam 34 for particular operations. The beam 34 passes from the controller 36 to a scanner 38 which in this instance comprises a set of controllable mirrors which can direct the beam 34 along an XY axis of the semiconductor device. As further shown in FIG. 1, the scanner 38 may include optical elements which can aid in focusing the beam 34.

As further shown in FIG. 1, a semiconductor device 10 is disposed upon a support 40, which in this instance is a support table. The support 40 may be fixed, or it may also be movable relative to the laser system 30 so as to further facilitate scribing. As shown, the beam 34 is focused onto the device 10 and scanned across the surface of the device; and in the illustrated embodiments, several scribe lines 42a-42c have been formed on the device 10.

The scanning system has been illustrated, in FIG. 1, in a very schematic sense so as to illustrate the critical components thereof. However, it is to be understood that support framework, power supplies, cooling lines, and the lice will typically be included in a scribing system. However, such elements are well known to those of skill in the art and for simplicity of illustration have not been included herein. Also, it should be noted that while the system of FIG. 1 shows a scan being carried out on a single device 10, scanning may be carried out on a large web of material as part of an integrated fabrication process. In this regard, the scribing system may be incorporated into a roll-to-roll processing unit and may be implemented in scribing stations operative at different portions of the processing apparatus and in different stages of the fabrication process. Again, all of such embodiments and modifications will be apparent to those of skill in the art in view of the teaching presented herein.

Aspects of the invention will be illustrated with regard to a method for the fabrication of one exemplary type of photovoltaic module as depicted in FIGS. 2-9. It is to be understood that the methods described herein may be adapted for the fabrication of other types of semiconductor devices, including photovoltaic devices, display devices, photosensors, and non-photosensitive devices.

Figure 2:
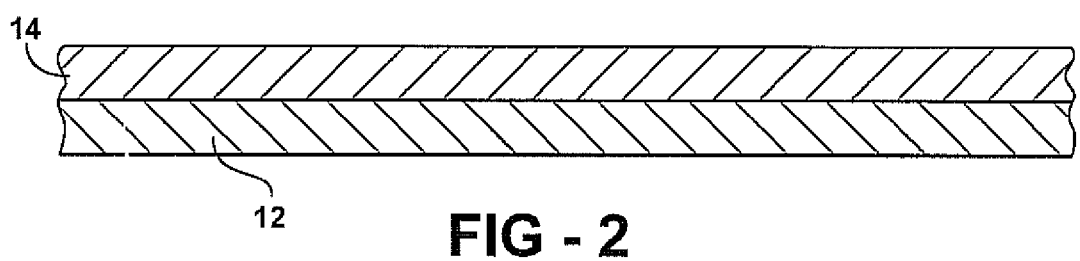
FIG. 2 is a cross-sectional view of a first stage in the fabrication of a semiconductor device showing a substrate having a first electrode material disposed thereupon.

In a first step of this particular process as shown in FIG. 2, a body of electrode material 14 is disposed upon a substrate 12. In the fabrication of ultra lightweight photovoltaic devices, substrates typically comprise thin bodies of polymeric material such as a polyimide material sold under the designation Kapton although other substrates, including metal foil substrates, composite substrates and the like may be employed. The first electrode 14 is, in particular instances, comprised of a layer of metal, having good electrical conductivity and good reflectivity for photoactive wavelengths. As such, this first electrode 14 is at times referred to as a back reflector layer. In other instances, other electrode materials, including transparent conductive oxide materials, may be employed as a first electrode. As is known in the art, this electrode layer 14 may include further materials including current buffer layers, optical layers, electrode grid structures and the like. In that regard, the invention may be practiced in combination with a wide variety of substrates and electrodes.

Figure 3:
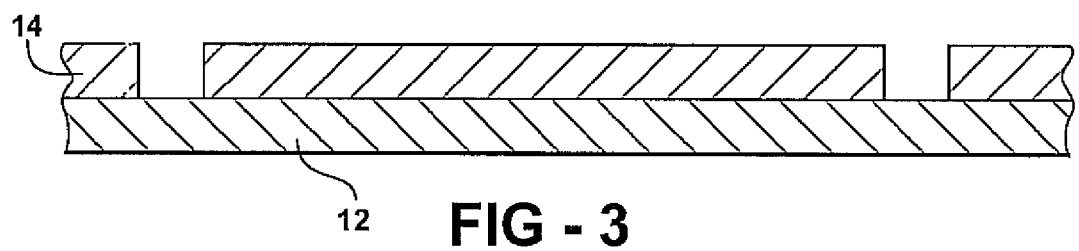
FIG. 3 is a cross-sectional view of the device of FIG. 2 following the scribing of the first electrode layer.

In a second step of the process as is shown in FIG. 3, the first electrode layer 14 is scribed through to the substrate layer so as to form a number of electrically isolated segments. In one embodiment of module, the width of the segments is approximately 1 centimeter; however, other configurations are contemplated. Scribing of this first electrode may be carried out utilizing either long-wavelength laser output, typically at 1000 nanometers or more, or short laser wavelengths, typically of 300 nanometers or less. In the case of the particular laser system described herein, the primary, long wavelength, beam output is at 1064 nm, and the short wavelength deep ultraviolet output is at 266 nm. It has been found that in a laser scribing process, some of the first electrode material which is ablated away may redeposit along the scribed lines producing short circuits in the finished device and/or creating pinholes in subsequently deposited layers. Therefore, it is desirable to clean away any such debris, and it has been found that ultrasonic cleaning of the scribed electrode/substrate combination is effective in providing clean, electrically isolated scribes.

Figure 4:
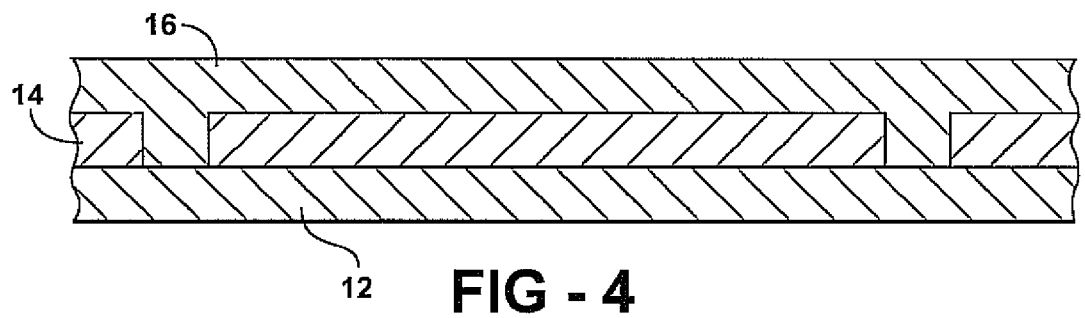
FIG. 4 shows a further step in the fabrication of the semiconductor device wherein a layer of semiconductor material is disposed atop the scribed electrode.

In a subsequent step, as is shown in FIG. 4, a body of semiconductor material 16 is deposited atop the scribed substrate/first electrode combination. This semiconductor material 16 may, in the instance of the fabrication of photovoltaic devices, comprise a photovoltaically active assemblage of semiconductor layers. In particular instances, the semiconductor body includes at least one triad comprised of a layer of substantially intrinsic semiconductor material interposed between oppositely doped (P and N) layers. This assemblage of layers creates a photovoltaic device. In specific instances, a plurality of such triads are stacked in an optical and electrical series relationship to produce a multi-junction cell. In particular instances, the semiconductor body is comprised of thin film layers of group IV semiconductor materials, such as silicon-containing materials, germanium-containing materials and silicon:germanium-containing materials. Such technology is well known and described in the art. As will be seen, the semiconductor body 16 at least partially fills in the scribed lines in the first electrode 14.

Figure 5:
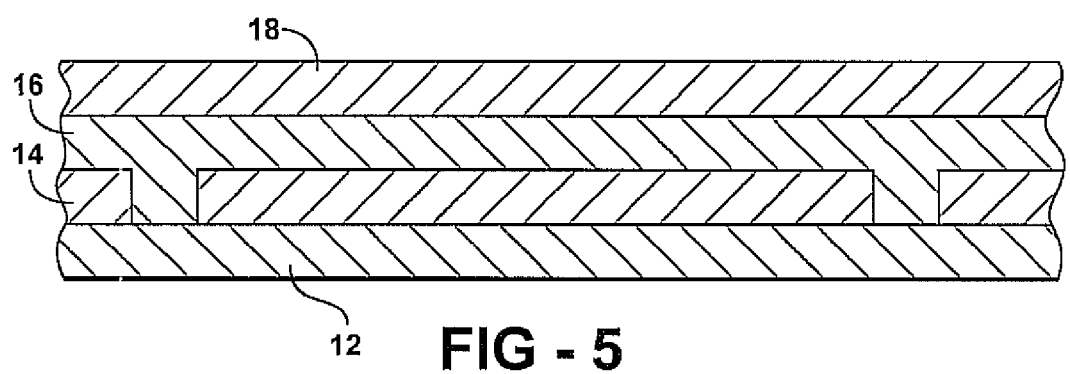
FIG. 5 is a depiction of a further step in the fabrication of the semiconductor device wherein a top electrode layer is disposed upon the semiconductor body.

As is shown in FIG. 5, a second, top electrode 18 is deposited in a superposed relationship with a semiconductor body 16. As particularly depicted, the top electrode is directly upon the semiconductor body 16; however, it is to be understood that this layer, just like the first electrode 14, may be separated from the semiconductor body 16 by intervening layers as is known in the art. In a typical photovoltaic device, this second, top, electrode 18 is fabricated from an electrically conductive, optically transparent material such as a metal oxide. Some such metal oxides include oxides of zinc, tin, indium and the like. In a particular instance, the electrode is fabricated from indium tin oxide.

Figure 6:
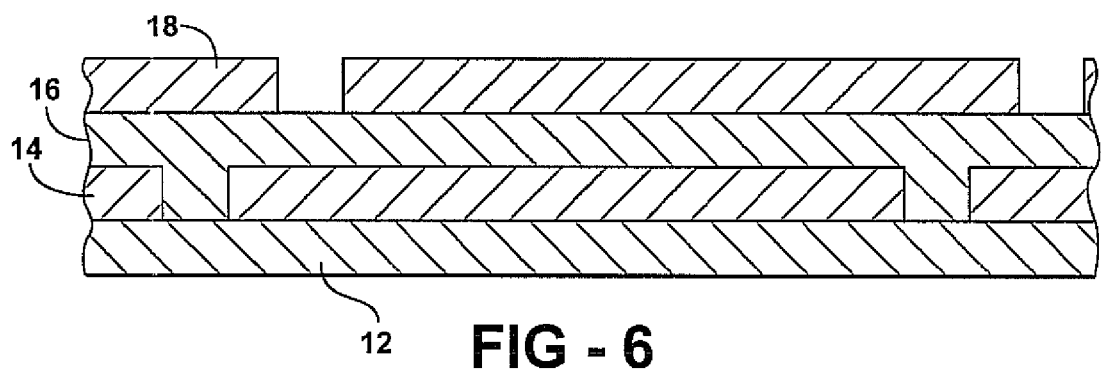
FIG. 6 shows a further step in the fabrication of the semiconductor device wherein the top electrode layer is scribed.

It has been found in the prior art that laser scribing of an indium tin oxide layer disposed atop a thin film semiconductor body such as a group IV thin film semiconductor material can cause damage to the semiconductor material as a result of overheating. The damage to the semiconductor layer can short the device between the two electrodes and/or create an electrically conductive path across scribed portions of the top electrode. Such damage can affect the function of the photovoltaic module. In accord with the present invention, as is shown in FIG. 6, it has been found that use of a "cold" wavelength of 300 nanometers or less allows for scribing to be carried out without causing such damage. In particular, the scribing is carried out using short wavelength illumination and short pulse durations, typically in the range of 5-50 nanoseconds, and in particular instances, 5-15 nanoseconds, and in a specific instances approximately 10 nanoseconds. In yet other instances, still shorter pulse durations may be used, and such may be achieved through the use of technologies such as mode-locked picosecond and femtosecond lasers. As with regard to the first laser scribing process of FIG. 3, it has been found advantageous, in some instances, to ultrasonically clean the device following scribing of the top electrode to remove any debris therefrom.

A further step may be carried out in the fabrication process, and that involves isolation laser scribing. This step is carried out after the scribing of the second electrode 18, and operates to remove all material down to the substrate level in selected portions of the device. This is for the purpose of isolating what will ultimately become a connected string of cells from the remainder of the substrate. This isolation scribing, when implemented, can be done utilizing high laser power, typically at short wavelengths.

Figure 7:
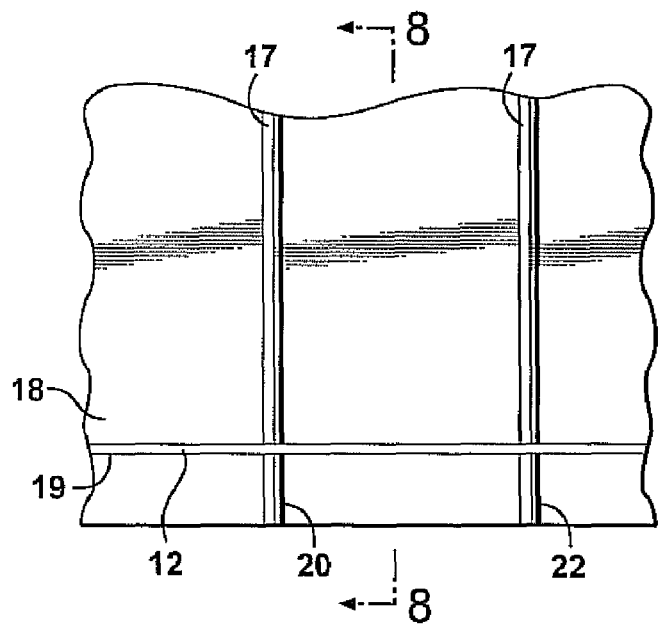
FIG. 7 is a top plan view of a semiconductor device prepared according to the method of the present invention.

Referring now to FIG. 7, there is shown a top plan view of a portion of a semiconductor device, generally similar to the devices discussed with reference to FIGS. 2-6, following the scribing of an isolation channel therein. As shown in FIG. 7, an isolation channel 19 is scribed across the front face of the semiconductor device. This channel passes through the top electrode layer 18 as well as through the subjacent semiconductor layer and bottom electrode layer, both of which are not visible in this top plan view. The channel 19 exposes a portion of the substrate layer 12 at its base. Since the substrate is electrically insulating, this channel 19 effectively isolates portions of the device from electrical contact with one another. Also apparent in FIG. 7 is a series of interconnect welds 20 and 22 as well as scribe lines 17 in the top electrode layer 18. These features will be better seen and understood with reference to FIG. 9 which will be discussed below.

Figure 8:
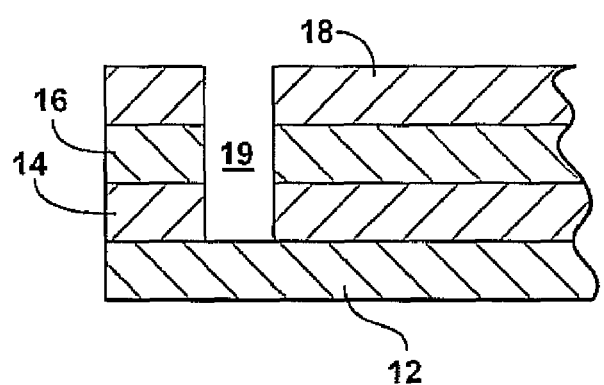
FIG. 8 is a cross-sectional view of the semiconductor device of FIG. 7 taken along line 8-8.

Referring now to FIG. 8, there is shown a cross-sectional view of the device of FIG. 7 taken along line 8-8. FIG. 8 better illustrates the scribed isolation channel 19 with regard to its positional relationship with the substrate 12, bottom electrode layer 14, semiconductor layer 16 and top electrode layer 18.

Figure 9:
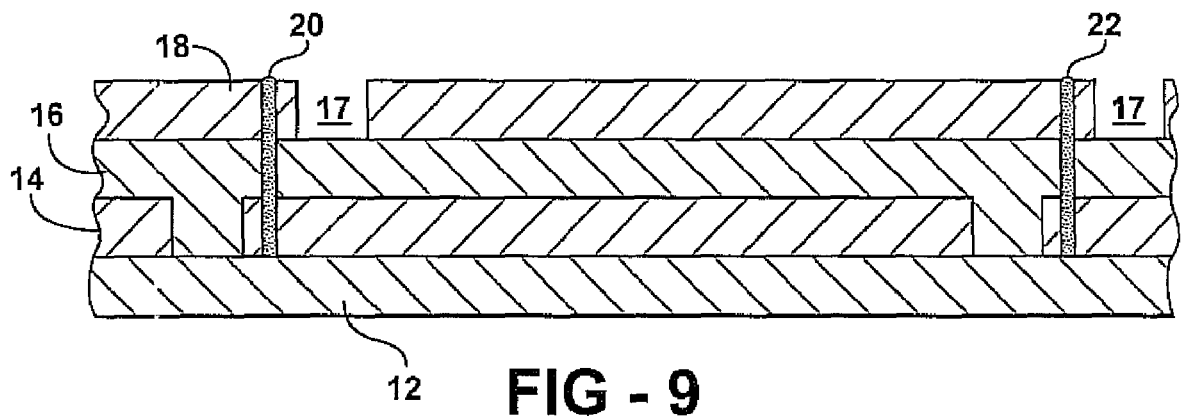
FIG. 9 is a cross-sectional view of the semiconductor device following a step wherein conductive channels are formed between the top and bottom electrodes.

Referring now to FIG. 9, there is shown a final step in this portion of the fabrication process. In FIG. 9, interconnect welds, shown at reference numerals 20, 22, are formed in the device so as to extend from the first electrode 14, through the semiconductor body 16, to the second electrode 18. These welds form a relatively low resistance electrical path through the semiconductor body and effectively electrically interconnect segments of the scribed, bottom electrode 14 with adjacent segments of the scribed top electrode. In this manner, individual, series connected photovoltaic cells are formed. The fact that the lateral resistivity of the semiconductor body 16 is quite large limits shorting between portions of adjacent cells. The interconnect welding can be implemented using long wavelength radiation such as 1064 mn. In particular instances, it has been found that superior interconnection is established by using two parallel dotted lines of welds passing through a module.

The foregoing general process may be implemented in a variety of specific processes for the fabrication of ultra lightweight photovoltaic devices. In one specific group of processes, modules comprising monolithically integrated, series interconnected photovoltaic devices were prepared on thin, approximately 0.7 mil thick, polyimide material. As is known in the art, the polyimide was initially supported on a stainless steel carrier and this carrier was subsequently removed by etching following module fabrication. In this process, each module included approximately 20 strip cells connected in series. The operating voltage for such modules is approximately 30 volts and the dimension of each module is approximately 25 centimeters by 20 centimeters. The modules were fabricated onto a substrate comprising the 0.7 mil polyimide supported on stainless steel. The polyimide substrate was coated with a bottom electrode, back reflector material comprising a layer of silver having a layer of ZnO thereatop. The back reflector coated substrate material was cut into slabs of approximately 14 by 20 inches for batch processing. In a first step, the back reflector/electrode layer was scribed as described above. A semiconductor body comprising a triple junction grouping of layers was deposited thereatop. As described above, a triple junction device includes three stacked triads of p-i-n configuration disposed in an optical and electrical series relationship. The triads were comprised of group IV hydrogenated alloys as known in the prior art. A transparent, indium tin oxide based top electrode layer was disposed atop the semiconductor body. The thus-produced cell was short-passivated to remove shunts and shorts in the device and the ITO layer was then laser scribed to form electrically isolated segments. Laser welding was then carried out in accord with the description of FIG. 9 to interconnect ti he top ITO layer of one segment to the back reflector electrode layer of the adjacent segment. Following scribing and interconnecting, a top protective layer of a silicone material was deposited onto the device. This layer had a thickness of approximately 0.1 mil. Following these processing steps, a chemical etching step was then used to remove the stainless steel. The resulting freestanding laser-integrated module was trimmed to the desired dimensions and positive and negative contacts were affixed. It was found that this process reliably produced high quality devices in high yields. Clearly, in view of the teaching presented herein, the methods and systems of the present invention may be readily adapted for the manufacture of other configurations of electronic devices.

The foregoing principles may be adapted to the fabrication of a variety of otherwise configured devices including, but not limited to, photovoltaic devices. The foregoing drawings, discussion and description are illustrative of specific embodiments of this invention, but are not meant to be limitations upon the practice thereof. It is the following claims, including all equivalents, which define the scope of the invention.

The invention claimed is:

1. A method for fabricating a semiconductor device, said method comprising the steps of:
    providing a substrate;
    depositing a body of a first electrode material on said substrate;
    scribing said body of first electrode material so as to form a plurality of spaced apart, electrically isolated portions of said body of first electrode material;
    depositing a body of semiconductor material in a superposed relationship with said scribed, first electrode;
    depositing a second electrode in a superposed relationship with said semiconductor body;
    laser scribing said second electrode with a laser having an output wavelength of 300 nanometers or less; and
    illuminating at least one selected portion of said second electrode with a laser beam so as to form an electrically conductive channel through the body of semiconductor material, said channel having an electrical resistivity which is lower than the electrical resistivity of the remainder of said semiconductor body, said channel extending between said first and second electrodes.

2. The method of claim 1, wherein the step of scribing said first electrode comprises laser scribing said first electrode.

3. The method of claim 2, wherein said step of laser scribing said first electrode comprises utilizing a laser beam having a wavelength of at least 1000 nanometers.

4. The method of claim 1, including the further step of ultrasonically cleaning said first electrode after said step of scribing.

5. The method of claim 1, wherein said semiconductor body comprises at least one layer of a thin film semiconductor material incorporating an element selected from the group consisting of silicon, germanium, and combinations thereof.

6. The method of claim 1, wherein said body of semiconductor material comprises at least one triad of thin film semiconductor layers comprising a layer of substantially intrinsic semiconductor material interposed between oppositely doped layers of semiconductor material.

7. The method of claim 1, wherein said first electrode includes a layer of a metal.

8. The method of claim 1, wherein said second electrode comprises a transparent, electrically conductive metal oxide.

9. The method of claim 1, wherein said first and second electrodes are scribed in a laser scribing process, wherein the first electrode is scribed with a laser beam having a wavelength greater than the wavelength of the beam which is used for the laser scribing of said second electrode.

10. The method of claim 9, wherein a single laser provides said first and second wavelengths.

11. The method of claim 10, wherein a single optical system is used to scribe said first and second electrodes, said optical system being operative to scan a laser beam across said electrodes.

12. The method of claim 1, wherein said step of laser scribing said second electrode is carried out using picosecond or femtosecond laser pulses.

* * * * *